United States Patent
Shan et al.

(10) Patent No.: US 6,346,361 B1
(45) Date of Patent: Feb. 12, 2002

(54) METHOD FOR SYNTHESIZING POLYMERIC AZO DYES

(75) Inventors: Jianhui Shan, High Bridge; Shuji Ding, Branchburg; Eleazar B. Gonzalez, Bloomfield; Dinesh N. Khanna, Flemington, all of NJ (US)

(73) Assignee: Clariant Finance (BVI) Limited (BV)

( * ) Notice: Subject to any disclaimer, the term of this patent is extended or adjusted under 35 U.S.C. 154(b) by 0 days.

(21) Appl. No.: 09/413,181

(22) Filed: Oct. 6, 1999

(51) Int. Cl.$^7$ .................. G03F 07/021; C08G 63/91
(52) U.S. Cl. .................. 430/168; 430/169; 430/175; 430/176; 430/510; 430/512; 525/52
(58) Field of Search .................. 430/175, 176, 430/510, 512, 169, 168; 524/80; 525/52

(56) References Cited

U.S. PATENT DOCUMENTS

| | | | | |
|---|---|---|---|---|
| 4,252,718 A | * | 2/1981 | Atherton et al. | 260/207 |
| 4,533,446 A | * | 8/1985 | Conway et al. | 204/159.24 |
| 5,086,168 A | * | 2/1992 | Rieper | 534/579 |
| 5,886,102 A | | 3/1999 | Sinta et al. | |
| 5,981,145 A | | 11/1999 | Ding et al. | |
| 5,994,430 A | * | 11/1999 | Ding et al. | 524/80 |

OTHER PUBLICATIONS

"Micromixing and Fast Chemical Reactions in Static Mixers," J.R. Bourne and H. Maire, Chem. Eng. Process. vol. 30, 1991, pp. 23–30.

"Micromixing and Fast Chemical Reactions in a Turbulent Tubular Reactor," J.R. Bourne and G. Tovstiga, Chem Eng Res Des, vol. 66, Jan. 1988, pp. 26–32.

"Characteristics of a Simple Injector for Mixing and Fast Chemical Reations in a Tubular Reactor," J. Armand, J.R. Bourne, Icheme Symposium Series No. 136, pp. 211–216.

"Fast Chemical Reaction in High Intensity Ystral Dynamic Mixer," J.R. Bourne and J. Garcia–Rosas, $5^{th}$ European Conference on Mixing, Wurzburg, West Germany, Jun. 10–Jun. 12, 1985, Paper 10, pp. 81–87.

"Study on Micromixing in Tubular Reactor," G. Weixing, D. Gance, UNILAB Research Center of Chemical Reaction Engineering, East China University of Chemical Technology, Shanghai 200237, China, pp. 1555–1561.

"Mixers–Static," Cole–Parmer Instrument Company Brochure, ©1998.

* cited by examiner

Primary Examiner—John S. Chu
(74) Attorney, Agent, or Firm—Andrew F. Sayko, Jr.; Krishna G. Banerjee

(57) ABSTRACT

A method of coupling a diazonium salt with an organic polymer comprising, on order, the steps of: providing a polymer in one liquid phase; providing an diazonium salt in a separate liquid phase; contacting the separate phases, and thereby reacting the polymer and the diazonium salt.

8 Claims, 1 Drawing Sheet

METHOD FOR SYNTHESIZING POLYMERIC AZO DYES

FIELD OF THE INVENTION

The present invention is directed to a method for synthesizing polymeric azo dyes from a diazonium salt and a polymer. The resulting polymeric azo dye compounds are useful in antireflective coating compositions used in conjunction with photoresist materials in producing microelectronic devices.

BACKGROUND OF THE INVENTION

It has been observed that many chemical manufacturing processes, which provide acceptable results on a small or lab scale, prove to be impractical or not economical, when an attempt is made to adopt such processes to large-scale production. This is true when preparing products via fast reaction(s) of two or more compounds, which are contained in two or more separate phases. This type of fast reaction requires rapid interfacial mixing (in both the macro and micro scope) so that the reactant carried in one phase makes immediate intimate contact with the reactant(s) contained in the other phase(s). This enables an efficient and substantially complete chemical reaction(s) to take place between the reactants from all phases before possible competitive side reactions take place. An example of such a reaction is the azo-coupling of a polymer with a diazonium salt. When the diazonium salt is reacted with the polymer under basic conditions the result is the addition of an azo chromophore to the polymer, for example as set forth below:

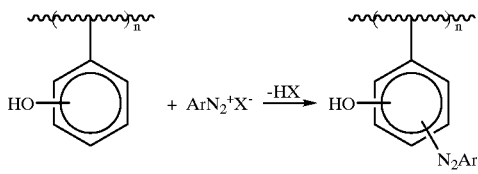

The diazonium salt may be soluble in one solvent, such as water, producing a first phase. The polymer may be soluble in another solvent, such as an organic solvent, which produces a second separate phase. Such an azo coupling is capable of taking place in a very short period of time, provided that there is intimate mixing and sufficient contact between the reactants.

For the purposes of this application, a diazonium salt is preferably derived from the diazotization of a corresponding amine, preferably an aromatic amine, followed by a diazotizing reagent, such as a nitrite salt, in the presence of an acid, such as HCl, $H_2SO_4$, etc. Most diazonium salts are relatively stable in acidic conditions at a cold temperature, from about 0° C. to about 15° C. However, if the polymer solvent blend with which the diazonium salt is reacted is basic, this can have an adverse impact because the diazonium salt tends to decompose or undergo side reactions, under such basic conditions, to form a number of possible undesirable side products, for example as set forth below:

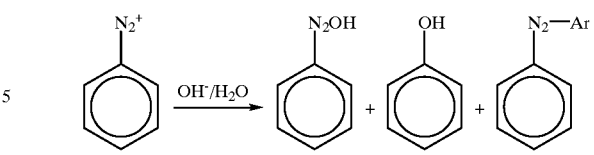

Therefore, if the coupling reaction proceeds too slowly, the diazonium salt has sufficient time to undergo such side reactions or decomposition and the desired end product is not obtained.

When a chromophore, such as a diazonium salt is added to a polymer the standard practice would be to use a reaction vessel equipped with an agitator. In the lab when small vessels are employed, this set up works well at high agitation speeds. As the size of the vessel increases this set up loses its effectiveness, resulting in progressively lower yields of the desired product. In experimental settings with one-kilogram or smaller scale equipment, some options may still be available to improve the overall mixing in the vessel, such as the addition of more than one agitator or additional agitation blades. However, in scaling up for large-scale commercial production, these options may be too costly. Running the reaction on a commercial scale without sufficient agitation results in a very poor yield of the desired product and the generation of undesired side products that are difficult and costly to remove. Therefore, a need exists for a commercial-scale chemical process, which favors the azo coupling of the polymer while at the same time substantially reducing the competing reaction(s), such as the decomposition of the diazonium salt.

U.S. Pat. No. 5,886,102 teaches that in the production of antireflective coating compositions the "grafting of chromophore units onto a preformed resin often provides a resin mixture of polymers with varying percentages of chromophore. Such differing quantities of chromophore units can compromise resolution of an image patterned into an overcoated photoresist layer as the chromophore differences may result in essentially random reflections of exposure radiation." This reference goes on to explain that "[g]rafting chromophore units onto at least some types of preformed polymers may be quite difficult, or simply not possible, particularly in larger scale productions. For example, it can be particularly difficult to drive the reaction to completion resulting in undesired products which must be removed from desired materials."

An article in Chemical Engineering and Processing teaches the synthesis of an azo dye via azo coupling of a diazonium salt and a monomer. Specifically, the monomer, 1-naphthol, is reacted with a diazotized sulphanilic acid solution using a static in-line mixer. The static mixer is described as having no moving parts, instead it consists of fixed elements that progressively reduce radial gradients of concentration and temperature by combining, stretching, splitting and recombining two separate but miscible streams.

It should be noted that phase transfer catalysts are available for the reaction of two or more reactants contained in two or more separate phases. Such catalysts can be used in cases where the purity of the final product is not a major concern. However, in applications where even relatively low levels of impurities pose a problem, a phase transfer catalyst is not an option because it may be too costly and very difficult, if not impossible, to separate such impurities from the desired final product. This is especially true in applications where impurities are required to be from less than 1 part per million to as low as less than 20 parts per billion.

SUMMARY OF THE INVENTION

A method for coupling a diazonium salt with a polymer is provided, which method comprises, in the following order, the steps of: dissolving an organic polymer having a weight average molecular weight ranging from about 500 to 2,000,000 in a solvent, and thereby providing one liquid phase; providing a diazonium salt in another solvent, and thereby providing a separate liquid phase; contacting the diazonium salt with the organic polymer, preferably by intimately mixing the separate phases, for a time at least equal to the minimum reaction time required to react the diazonium salt with the polymer ("minimum contact time"), and thereby reacting the diazonium salt and the organic polymer for a period of time at least equal to such minimum reaction time. Preferably the mole ratio of organic polymer to diazonium salt is from 90:10 to 10:90, more preferably from about 75:25 to 25:75, and most preferably from 60:40 to 40:60.

An in-line mixing unit capable of intimate mixing is preferably provided, which (mixing unit) has a sufficient length to provide a contact time that is greater than or equal to the minimum reaction time. The in-line mixing unit is preferably selected from a static tubular reactor or a dynamic mixer. The organic polymer and diazonium salt are preferably reacted in the in-line mixing unit, which initially provides rapid interphase macro- and micro-mixing, thus enabling an efficient and substantially complete chemical reaction to take place, without any substantial side reactions or decomposition of the diazonium salt.

A process for producing an antireflective coating composition is also provided, which process comprises, in the following order, the steps of: dissolving an organic polymer having a weight average molecular weight ranging from about 500 to 2,000,000 in a solvent, and thereby providing one liquid phase; providing a diazonium salt in another solvent and thereby providing a separate liquid phase; contacting the diazonium salt in contact with the organic polymer, preferably by intimately mixing the separate phases, for a time at least equal to the minimum reaction time required to react the diazonium salt with the polymer ("minimum contact time"), and thereby reacting the diazonium salt and the organic polymer for a period of time at least equal to such minimum reaction time. The organic polymer-diazonium salt reaction product is then dissolved in a suitable solvent, thereby providing an antireflective coating composition.

A process is also provided for forming an image on a substrate, which process comprises, in the following order: dissolving an organic polymer, having a weight average molecular weight ranging from about 500 to 2,000,000 in a solvent, and thereby providing one liquid phase; providing a diazonium salt in another solvent, and thereby providing a separate liquid phase; contacting the diazonium salt with the organic polymer, preferably by intimately mixing the separate phases, for a time at least equal to the minimum reaction time required to react the diazonium salt with the organic polymer ("minimum contact time"), and thereby reacting the diazonium salt and the organic polymer for a period of time at least equal to such minimum reaction time. The organic polymer-diazonium salt reaction product is then dissolved in a solvent, thereby providing an antireflective coating composition. The process further comprises, in the following order; either before or after coating a photoresist composition onto a suitable substrate, coating the antireflective coating composition onto such a suitable substrate; heating the coated substrate, and thereby substantially removing the photoresist solvent; imagewise exposing the photoresist composition; and developing the imagewise exposed photoresist composition.

DESCRIPTION OF THE PREFERRED EMBODIMENTS

Figure 1:
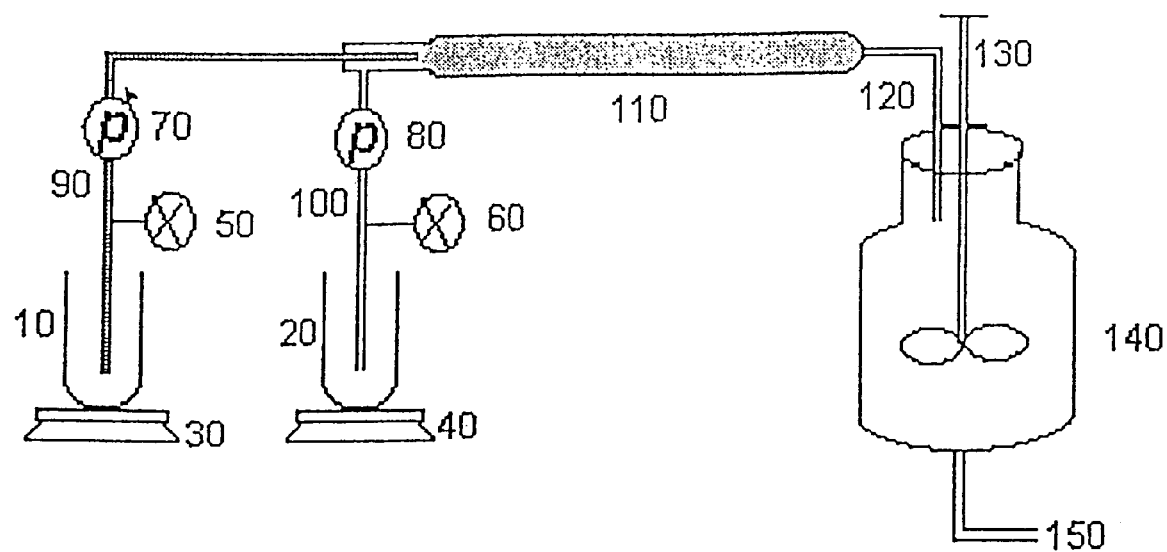
FIG. 1 A schematic view of an apparatus for synthesis of polymeric azo dyes produced according to the process of the present invention, using a tubular in-line static mixer.

A method is provided for coupling a diazonium salt with an organic polymer comprising, in the following order, the steps of: dissolving an organic polymer in a solvent to thereby provide one liquid phase; providing a diazonium salt in another solvent, and thereby providing a separate liquid phase that is either miscible or partially miscible or immiscible with the first liquid phase; contacting the diazonium salt with the organic polymer, such as by providing an in-line tubular mixing/reaction unit 110, as shown in FIG. 1, which has a sufficient length to provide a contact time that is greater than or equal to the minimum reaction time required for the reaction of the diazonium salt with the organic polymer, and thereby reacting the organic polymer and the diazonium salt, for a period of time at least equal to such minimum reaction time, in the in-line mixing unit.

Minimum reaction time is defined as the minimum amount of time necessary to react two or more reactants to obtain the desired product in a yield that is commercially acceptable. Commercially acceptable yields can range from a single digit percentage to a 100% yield, though only in very few cases would a yield as low as 10% to 25% be acceptable. A small number of cases exist where a yield of 25% to 50% is acceptable. A majority of the commercially viable cases have a yield of 50% or greater, with preference given to yields of 80% and greater, with greater preference given to yields of 90% or greater.

The azo coupling reaction is often very rapid, with a minimum reaction time of as little as ten microseconds, in the presence of good intimate mixing of the reactants. These reactions have a minimum reaction time, in the presence of such good mixing, from ten microseconds to 120 minutes, many from ten milliseconds to 60 minutes, while most are from 0.1 seconds to 10 minutes. It is believed that in such rapid reactions, such as these azo coupling reactions, a yield up to a given percentage (e.g. 50–70%) probably takes place very rapidly, but the last 30–50% yield of the reaction product may take much longer. Therefore, in many cases it may be beneficial to run the reaction longer than the minimum reaction time, when it is desired to maximize the yield of the final product.

Contact time is defined as the amount of time that two or more reactants are actually in intimate contact with one another, such that a reaction between the two or more reactants can efficiently take place. To assure that a complete reaction takes place and to maximize the yield, contact times are generally greater than the required minimum reaction time. Contact times of as little as 0.1 seconds are desired. Azo coupling reactions generally require contact times ranging from 0.1 seconds to 6 hours, however contact times in excess of two hours are rare. Most azo coupling reactions utilize contact times from 1 second to 120 minutes, while many require only from 2 seconds to 20 minutes. Process parameters such as flow rate can also have an effect on contact time, as do the length and diameter of the in-line mixing/reaction unit.

As shown in FIG. 1, this azo coupling reaction may be carried out by simultaneously pumping the diazonium salt solution from vessel 10 and the polymer solution from vessel 20 through an in-line tubular mixing/reaction unit 110, such as an in-line static mixer (available from Cole-Parmer Instrument Co.). Two gear pumps 70 and 80 are utilized to deliver the polymer solution and the diazonium salt solution from their respective vessels 10 and 20 to the in-line mixing unit 110. Gear pumps have been found to achieve smooth and substantially pulseless flow. The diazonium salt solution and the organic polymer solution are added in a molar ratio of from 100 to 1 to 1 to 100, preferably from about 5 to 1 to 1 to 5, of diazonium salt to organic polymer. The flow rates are measured gravimetrically by two balances 30 and 40 or flow rates can be monitored by flowmeters 50 and 60. The resulting azo-coupled product is carried by tubing 120 and precipitated into water in a precipitation vessel 140 and is collected as a solid. Optionally, precipitation vessel 140 has a means of agitation 130, such as an agitation blade or magnetic stirrer. The resulting precipitate is then sent to a filter 150.

Polymers are divided into two broad classes: inorganic polymers and organic polymers. For the purposes of this application, the polymer is an organic polymer. The organic polymer in this reaction is selected from polymers, which contain at least one of the following moieties:

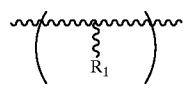

where,
$R_1$ is either: 1) a substituted or unsubstituted aromatic ring, such as phenyl, naphthyl or anthracyl, 2) a substituted or unsubstituted heterocyclic ring containing heteroatoms such as oxygen, nitrogen, sulfur or combinations thereof, such as pyrrolidinyl, furanyl, pyranyl or piperidinyl, or 3) a group having the structure:

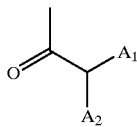

where,
$A_1$ and $A_2$ are independently selected from the groups: halo, —CN, —COZ, —COOZ, —CONHZ,—CONZ$_2$, —SO$_2$NHZ, —SO$_2$NZ$_2$, —SO$_2$Z, —SO$_2$CF$_3$, where Z is H, ($C_1$–$C_{10}$) alkyl, ($C_1$–$C_{10}$) hydroxyalkyl, ($C_1$–$C_{10}$) alkoxyl, ($C_1$–$C_{10}$) fluoroalkyl, ($C_1$–$C_{10}$) epoxyalkyl, ($C_1$–$C_{10}$) alkenyl, or a substituted or unsubstituted carbocyclic, aromatic or heterocyclic group such as but not limited to pyrrolidinyl, furanyl, pyranyl, phenyl, cyclohexyl, piperidinyl, or $A_1$ and $A_2$ may be —COOM, —SO$_3$M, where M is alkali metal, ammonium, or alkyl ammonium; or $A_1$ and $A_2$ may be combined to form a substituted or unsubstituted carbocyclic or heterocyclic ring containing an α-carbonyl group such as 2-cyclohexanoyl, 2-cyclopentanoyl, 2-(α-butyrolactoyl); and preferably also comprising a co-monomer moiety having the structure:

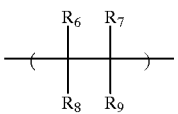

where,
$R_6$–$R_9$ are independently either halo, —O(CH$_2$)$_x$, H, —O(CH$_2$CH$_2$)$_x$OH (where x=1–10), —(OCH$_2$CH$_2$)$_y$OH (where y=0–10), —CN, —Z, —OZ, —OCOZ, —COZ,—COOZ, —NHZ, —NZ$_2$, —NHCOZ, —CONHZ, —NZCOZ, —CONZ$_2$, SZ, —SO$_3$Z,—SO$_2$NHZ, —SO$_2$NZ$_2$, —SO$_2$Z, —SO$_2$CF$_3$, where Z is H, ($C_1$–$C_{10}$) alkyl, ($C_1$–$C_{10}$) hydroxyalkyl, ($C_1$–$C_{10}$) alkoxyl, ($C_1C_{10}$) fluoroalkyl, ($C_1$–$C_{10}$) epoxyalkyl, ($C_1$–$C_{10}$) alkenyl, or may be —COOM, —SO$_3$M, where M is alkali metal, ammonium, alkyl ammonium, or $R_8$ and $R_9$ are combined to form a carbocyclic or heterocyclic group such as but not limited to a maleic anhydride or maleimide moiety. Preferably the polymer contains one or more moieties selected from:

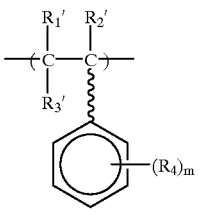

where,
$R_1'$–$R_3'$, and $R_4$ are independently either halo, nitro, —O(CH$_2$)$_x$OH, —O(CH$_2$CH$_2$)$_x$OH (where x=1–10), —(OCH$_2$CH$_2$)$_y$—OH (where y=0–10), —CN, Z, —OZ, —OCOZ, —COZ, —COOZ, —NHZ, —NZ$_2$, —NHCOZ, —CONHZ, —NZCOZ, —CONZ$_2$, —SZ, —SO$_3$Z, —SO$_2$NHZ, —SO$_2$NZ$_2$, —SO$_2$Z, —SO$_2$CF$_3$, where Z is H, ($C_1$–$C_{10}$) alkyl, ($C_1$–$C_{10}$) hydroxyalkyl, ($C_1$–$C_{10}$) alkoxyl, ($C_1$–$C_{10}$) fluoroalkyl, ($C_1$–$C_{10}$)epoxyalkyl, ($C_1$–$C_{10}$) alkenyl, substituted or unsubstituted carbocyclic or heterocyclic group such as but not limited to pyrrolidinyl, furanyl, pyranyl, piperidinyl, or may be COOM, —SO$_3$M, where M is alkali metal, ammonium, alkyl ammonium, or $R_1'$ and $R_2'$ are combined to form a carbocyclic or heterocyclic group such as but not limited to a maleic anhydride or maleimide moiety; and m=0-4; or:

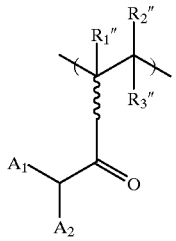

where, $R_{1''}$–$R_{3''}$ are independently either —Z, —OZ, —OCOZ, —COZ, —COOZ, —NHZ,—NZ$_2$, —NHCOZ, —CONHZ, —NZCOZ, —CONZ$_2$, —SZ, —SO$_3$Z, —SO$_2$NHZ, —SO$_2$NZ$_2$, —SO$_2$Z, —SO$_2$CF$_3$, where, Z is H, (C$_1$–C$_{10}$) alkyl, (C$_1$–C$_{10}$) hydroxyalkyl, (C$_1$–C$_{10}$) alkoxyl, (C$_1$–C$_{10}$) fluoroalkyl, (C$_1$–C$_{10}$) epoxyalkyl, (C$_1$–C$_{10}$) alkenyl, a substituted or unsubstituted carbocyclic or heterocyclic group such as but not limited to pyrrolidinyl, furanyl, pyranyl, piperidinyl, or $R_1''$ and $R_2''$ are combined to form a 3–10 membered carbocyclic or heterocyclic group such as a maleic anhydride or a maleimide moiety; A$_1$ and A$_2$ are independently selected from the group: halo, —CN, —COZ, —COOZ, —CONHZ, —CONZ$_2$, —SO$_2$NHZ, —SO$_2$NZ$_2$, —SO$_2$Z, —SO$_2$CF$_3$, where Z is H, (C$_1$–C$_{10}$) alkyl, (C$_1$–C$_{10}$) hydroxyalkyl, (C$_1$–C$_{10}$) alkoxyl, (C$_1$–C$_{10}$) fluoroalkyl, (C$_1$–C$_{10}$) epoxyalkyl, (C$_{1-0}$) alkenyl, 3–10 membered substituted or unsubstituted carbocyclic or heterocyclic group such as but not limited to pyrrolidinyl, furanyl, pyranyl, piperidinyl, or may be —COOM, —SO$_3$M, where M is alkali metal, ammonium, alkyl ammonium;

A$_1$ and A$_2$ may be combined to form a 3–10 membered substituted or unsubstituted carbocyclic or heterocyclic ring containing an α-carbonyl group such as 2-cyclohexanoyl, 2-cyclopentanoyl, or 2-((α-butyrolactoyl);

and preferably also having one or more comonomer moieties of the previously defined formula:

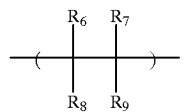

For the purposes of this application the symbols: ～～, or each signify either a direct bond to an organic group or an organic chain comprising either the same or different organic groups, such as methylene, ethylene, etc. This is illustrated by the following formula wherein $R_{1''}$, $R_{2''}$, $A_{1'}$ and $A_{2'}$ are previously defined. X$_1$ and X$_2$ are independently —CO—, —OC(O)—, —CONH—O—, aryl, —(CH$_2$CH$_2$O)$_y$—(where y=0–10), (C$_1$–C$_{10}$) alkyl, cyclohexyl, —S—, —S—(C$_1$–C$_{10}$) alkyl, —O—(C$_1$–C$_{10}$) alkyl, —NH—, —N—(C$_1$–C$_{10}$) alkyl, or (C$_1$–C$_{10}$) hydroxyalkyl. n is independently 0–2.

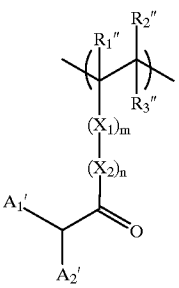

Organic polymers within the scope of the present invention include vinyl polymers such as disclosed in copending U.S. application Ser. No. 08/841,750 filed on Apr. 30, 1997, which include: 1) poly (vinylphenols), 2) substituted poly (vinylphenols), 3) poly (vinylphenol) copolymers, or 4) acrylate polymers, including methacrylates. These include poly p-hydroxystyrene-co-methyl methacrylate; poly p-hydroxystyrene; or poly 2-(methacryloyloxy)ethyl acetoacetate-co-methyl methacrylate.

Polymers having a weight average molecular weight of greater than or equal to 500 are preferred. Greater preference is given to polymers having a weight average molecular weight greater than or equal to 5000. Polymers, which fall into the following range are preferred, polymers where the weight average molecular weight ranges from about 500 to 2,000,000; more preferably from about 3,000 to 1,000,000; and most preferably from about 5,000 to 80,000. These polymers are dissolved in an organic solvent, mixed organic solvents or organic solvents mixed with water.

The cation of the diazonium salt has the general structure:

ArN$_2^+$ where, Ar is an aryl group. The aryl group is selected from: 1) a substituted or unsubstituted aromatic ring, such as phenyl, naphthyl or anthracyl, or 2) a substituted or unsubstituted heterocyclic ring containing heteroatoms, such as oxygen, nitrogen, sulfur or combinations thereof, such as pyridinyl, or a thiophene moiety. The diazonium salt anion can be any negatively charged ion. Examples of such anions include —Cl, —Br, —NO$_3$,—HSO$_4$, —OCOCH$_3$, and —OH. Examples of such diazonium salts include those derived from aryl carboxylic acids, such as 4-NH$_2$C$_6$H$_4$CO$_2$H, or from other substituted aryl compounds, such as 4-aminoacetanilide.

The in-line mixing/reaction unit 110 is selected from a tubular reactor that provides static mixing or may be a dynamic mixer. Such dynamic mixers include a rotor stator and an in-line centrifugal pump, while tubular reactors include in-line static mixers and packed tubular reactors. A tubular reactor is a reaction vessel in the shape of a tube, where a tube is defined as a hollow cylinder or pipe long in proportion to its inner diameter. Any reaction vessel which is appreciably longer than its diameter can be said to be tubular, it can also be defined in terms of the ratio of length divided by inner diameter or:

Ratio=L (length)/D (inner diameter)

so that vessels having a L/D ratio in excess of 10 are considered tubular. While these can include vessels having extremely high numbers most will fall in the L/D ratio of 10 to 1,000, preferably having a ratio from 25 to 500.

The static tubular mixing unit has a void volume, which is determined by a defined length and inner diameter. The length of the tubular mixer is defined as the distance from a point where the two or more feed streams come into the mixer and begin to contact each other to a point where the product stream leaves the mixer into the precipitation container and the reaction stops. The contact time for the process of this invention is determined by dividing the void volume of the mixer by the total flow rate of the diazonium salt solution and the organic polymer solution. The length and the inner diameter of the mixer are adjusted so that the contact time is greater than or equal to the required minimum reaction time. Flow rate is defined as the volume of fluid that passes through any given path in a defined unit of time.

The static tubular mixing unit contains fixed mixing elements, which create turbulent energy dissipation, thereby promoting good macro-and micro-mixing. No moving mechanical parts are contained in the static tubular fixed element mixer. The fixed mixing elements progressively reduce radial gradients of concentration and temperature by combining, splitting, stretching and recombining two or more separate streams. This results in intimate mixing while at the same time introducing little to no shear into the reaction mixture. In large-scale production where an in-line mixing unit is not used, shear is transmitted through the agitator blade in the mixing vessel and often results in extra heat being introduced into the reaction mixture, which can result in the decomposition of the diazonium salt and substantially decrease the amount of desired end product. With the use of the in-line mixing unit, minimal mixing energy is introduced at the point of mixing so that the introduction of shear is minimized.

A packed column or reactor also falls into this general class of static mixers. The packed reactor is a tubular reaction vessel, which contains a packing material. The packing material is defined as an inert material that is frequently used in a distillation column to baffle the downward flow of countercurrent liquid. It may be, for example, glass fibers or beads, metal tubes called Raschig rings, metal chains, or specially shaped devices of various kinds (saddles, helices, rings, etc.).

A rotor stator mixer is a dynamic mixer, where a rotor turns inside a close fitting stator, as is well known in the art. Rotor speeds vary, but most rotors run at speeds of from 2000 rpm to 5000 rpm. The centrifugal force causes flow into the inside of the rotor, where the liquid flows radically outwards through the rotor and the slits in the stator and is subject to a very mild shearing action. When a dynamic mixer is used as the in-line mixing unit 110 the contact time can be extended by using longer tubing 120, which is counted in the length (L) determination for the reactor, until the reactants reach the water in precipitation vessel 140. Unlike a larger mixing vessel, the in-line dynamic mixer deals with a much smaller volume into which the reactants are introduced, which allows intimate contact to be maximized, while at the same time stratification of the reactant phases and the introduction of shear are minimized. The smaller volume of reactants being processed, at any given moment, by the in-line dynamic mixer also means that the reactants are under the influence of the pump or rotor stator for far less time than the conventional agitator blade in a reaction vessel. The small amount of shear that may be introduced has a chance to dissipate in the tubing 120 before the reaction mixture reaches vessel 140. In vessel 140 the azo coupling reaction mixture is quenched as it is mixed with water and the resulting product is precipitated.

In some applications, such as in the electronics industry, metal impurities can pose a serious problem. Many times undesirable metal ions can be introduced by simply mixing the reactants in a metal container, by using uncoated metal transfer tubes or metal agitator blades. In practicing the present process, one can minimize or eliminate this problem simply by avoiding contacting the reactants or the final product with metal. This can be accomplished by, e.g. providing: 1) glass-lined or Teflon® PTFE-coated vessels and agitator blades, 2) A plastic or Teflon®-coated static in-line mixer and inserts, and 3) a Teflon®-coated dynamic mixer.

The azo coupled polymer prepared by the method of the present invention is light absorbing and is useful in instances where light absorption is advantageous, particularly in antireflective coating compositions, or as light absorbing additives, for photosensitive compositions such as photoresists. Antireflective coatings are used in image processing by forming either a thin layer between a reflective substrate and a photoresist coating, or as a coating on top of a photoresist. Such compositions are especially useful in the fabrication of semiconductors and other microelectronic devices by photolithographic techniques. The polymer may also be used as an additive in photoresists to prevent or substantially reduce the reflection of light from the substrate.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of microelectronic devices has lead to the use of sophisticated multilevel systems to overcome difficulties associated with such miniaturization. The use of highly absorbing antireflective coatings in photolithography is a simple approach to diminish the problems that result from back reflection of light from highly reflective substrates. Two deleterious effects of back reflectivity are thin film interference and reflective notching. Thin film interference results in changes in critical line-width dimensions caused by variations in the total light intensity in the resist film as the thickness of the resist changes. Variations of line-width are proportional to the swing ratio (S) and therefore must be minimized for better linewidth control. Swing ratio is defined by:

$$S=4(R_{21}R_{22})^{1/2}e^{-\alpha D}$$

where, $R_{21}$ is the reflectivity at the resist/air or resist/top coat interface, $R_{22}$ is the reflectivity at the resist/substrate interface, $\alpha$ is the resist optical absorption coefficient, and D is the film thickness.

Bottom antireflective coatings function by absorbing the radiation used for exposing the photoresist, thus reducing $R_{22}$ and thereby reducing the swing ratio. Reflective notching becomes severe as the photoresist is patterned over substrates containing varying topographical features, which scatter light through the photoresist film, leading to linewidth variations, and in the extreme case, forming regions with complete resist loss. Similarly, top antireflective coatings reduce the swing ratio by reducing $R_{21}$, where the coating has the optimal values for refractive index and absorption characteristics, such as absorbing wavelength and intensity.

The azo coupled polymer prepared by the instant method is useful in an antireflective coating composition, which comprises the azo coupled polymer and a suitable solvent or mixtures of solvents. Other components may, optionally, be added to enhance the performance of the coating, e.g. crosslinking agents, thermal acid generators, monomeric dyes, lower alcohols, surface leveling agents, adhesion promoters, antifoaming agents, etc. Monomeric dyes may also be added to the antireflective coating, examples of which arc Sudan Orange, 2,4-dinitronaphthol, curcumin, coumarins and others.

The absorption of the antireflective coating can be optimized for a certain wavelength or ranges of wavelengths by the suitable choice of substituents on the dye functionality. Using substituents that are electron-withdrawing or electron-donating generally shifts the absorption wavelength to longer or shorter wavelengths, respectively. In addition, the solubility of the antireflective polymer in a particularly preferred solvent can be adjusted by the appropriate choice of substituents on the monomers.

The polymer is present in the antireflective coating composition in an amount from about 1% to about 40% by total weight of the solution. The exact weight used is partially dependent on the molecular weight of the polymer and the film thickness of the coating desired. Solvents, used as mixtures or alone, that might be used include PGME (Propylene Glycol Methyl Ether), PGMEA (Propylene Glycol Methyl Ether Acetate), EL (Ethyl Lactate), cyclopentanone, cyclohexanone, water, ($C_1$–$C_4$) alkyl alcohols, ketones, esters and gamma- butyrolactone, but PGME, PGMEA and EL or mixtures thereof are preferred. Solvents with a lower degree of toxicity, good coating and solubility properties are generally preferred. Examples of lower alcohols, ketones or esters are ethanol, isopropyl alcohol, butyl acetate, methyl amyl ketone, and acetone.

Since the antireflective film is coated on top of the substrate (either before or after coating with a photoresist composition) and is then normally subjected to dry etching, it is important that the film is of sufficiently low metal ion level and purity that the properties of the microelectronic device are not adversely effected. Treatments such as passing a solution of the polymer through an ion exchange column, filtration, and extraction processes can be used to reduce the concentration of metal ions and to reduce particles.

The antireflective coating composition is coated on the substrate using techniques well known to those skilled in the art, such as dipping, spincoating or spraying. The film thickness of the antireflective coating ranges from about 0.1 $\mu$m (micrometer) to about 1 $\mu$m (micrometer). The coating is further heated, such as on a hot plate or convection oven, to remove residual solvent and induce crosslinking, if desired, and insolubilizing the antireflective coatings to prevent intermixing between the antireflective coating and the photoresist.

Photoresists coated under or, preferably, over the antireflective film can be any of the types used in the semiconductor industry. It is preferred that the refractive index of the photoactive compound in the photoresist matches or is very close to that of the antireflective coating so that the reflectivity at the interface of the photoresist layer and the antireflective film can be substantially minimized or eliminated.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive-working photoresist compositions are currently favored over negative- working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron is necessary. In addition, it is almost always desirable that the developed photoresist wall profiles are to be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Positive-working photoresists comprising novolak resins or vinyl phenols as the film forming resin, and acid-generators or quinone-diazide compounds as the photoactive component are well known in the art. Novolak resins are typically produced by condensing formaldehyde and one or more multi-substituted phenols, in the presence of an acid catalyst, such as oxalic acid. Photoactive quinone diazide compounds are generally obtained by reacting multihydroxyphenolic compounds with naphthoquinone diazide acids or their derivatives.

Photoresists utilizing a vinyl phenol polymer as the film forming resin normally comprise polyhydroxystyrene or substituted polyhydroxystyrene derivatives, a photoactive component, and optionally a solubility inhibitor. The following references exemplify the types of photoresists used and are incorporated herein by reference, U.S. Pat. No. 4,491,628, U.S. Pat. No. 5,069,997 and U.S. Pat. No. 5,350,660.

When used as a bottom antireflective coating composition, the composition is used to form a film on the substrate and then heated, such as on a hotplate or convection oven at a sufficiently high temperature for a sufficient length of time to substantially remove the coating solvent, and crosslink the polymer if necessary, to a sufficient extent so that the film is not soluble in the coating solution of the photoresist or in the aqueous alkaline developer. An edge bead remover may be applied to clean the edges of the substrate using solvents and processes well known in the art. The preferred range for heating is from about 70° C. to about 250° C. If the temperature is below 70° C. then insufficient loss of solvent or insufficient amount of crosslinking takes place, and at temperatures above 250° C. the polymer may become chemically unstable. A film of photoresist is then coated on top of the antireflective coating and baked to substantially remove the photoresist solvent. The photoresist is imagewise exposed and developed in an aqueous developer to remove the treated resist. An optional heating step (post exposure bake) can be incorporated into the process prior to development and after exposure. The process of coating and imaging photoresists is well known to those skilled in the art and is optimized for the specific type of resist used. The patterned substrate can then be etched, such as by dry etching in a suitable etch chamber, to remove the exposed portions of the antireflective film, with the remaining photoresist acting as an etch mask.

An intermediate layer may be placed between the antireflective coating and the photoresist to prevent intermixing, and is envisioned as lying within the scope of this invention. The intermediate layer is an inert polymer cast from a solvent, where examples of the polymer are polysulfones and polyimides.

COMPARATIVE EXAMPLE 1

To a 1-L cooling-jacketed round-bottomed flask, were added, in sequence, 4-aminoacetanilide (AAA, 0.46 mole, 70.0 g), water (230 ml), and hydrochloride acid (37%, 77 ml) under stirring. The suspension was cooled to 0–5° C. Pre-chilled (about 15° C.) isobutyl nitrite (IBN, 0.46 mole, 50.1 g) was added to the flask. As AAA reacted, the newly formed diazonium salt dissolved in water to give a brownish solution.

In a 5-L round-bottomed flask, equipped with a mechanical stirrer and a temperature controller, poly p-hydroxystyrene-co-methyl methacrylate (PHS-MMA, 55-45 mole ratio, 0.36 mole, 79.2 g) was dissolved in tetrahydrofuran (THF, 1.2 L) and water (0.4 L), and cooled to 0–5° C. The pH of the PHS-MMA solution was adjusted to 12–13 by adding tetraethylammonium hydroxide (TMAH, 25%). The azo coupling reaction was carried out by adding the diazonium salt over a period of 1.5 hours to the PHS-MMA solution at a pH of 12–13. After the addition of the diazonium salt was completed, the reaction mixture was stirred for an additional hour. The azo-coupled product was precipitated into 6 L of water and collected as a reddish solid. The UV-Visible spectrum of the polymer in ethyl lactate showed λmax at 359 nm. A Gel Permeation Chromatograph (GPC) showed the polymer had a weight average molecular weight (Mw) of 18,000–22,000. Table 1 summarizes the extinction coefficient (E) of the azo coupled polymer product produced using both high and low agitation speeds. The data indicate that the extinction coefficient of the product was significantly affected by agitation speed.

TABLE 1

| Run # | Agitation Rate (RPM) | E (L/g.cm) | Yield (%) |
|---|---|---|---|
| 1 | 100 | 25 | 62 |
| 2 | 300 | 55 | 95 |

COMPARATIVE EXAMPLE 2

To a 5-L cooling-jacketed round-bottomed flask, were added in sequence AAA (4.67 mole, 700.0 g), water (2.3 L), and hydrochloride acid (37%, 0.7 L) under stirring. The suspension was cooled to 0–5 ° C. Pre-chilled IBN (4.87 mole, 502.0 g) was added to the flask over a period of 60 minutes. As AAA reacted, the newly formed diazonium salt dissolved in water to give a brownish solution.

In a 30-L reactor, equipped with an agitator and a temperature controller, PHS-MMA (55-45 mole ratio, 3.62 moles, 795.4 g) was dissolved in tetrahydrofuran (THF, 12.0 L) and water (4.0 L) and cooled to 0–5 ° C. The pH of the PHS-MMA solution was adjusted to 12–13 by adding TMAH (25 %). The azo coupling reaction was carried out by adding the diazonium salt over a period of 3 hours to the PHS-MMA solution at a pH of 12–13. After the addition of the diazonium salt was completed, the reaction mixture was stirred for an additional hour. The azo-coupled product was precipitated into 60 L of water and collected as a reddish solid. The UV-Visible spectrum of the polymer in ethyl lactate showed λmax at 359 nm. The GPC showed that the polymer had a Mw of 18,500–22,000. Table 2 shows that the agitation speed had significant impact on the extinction coefficient (E) of the azo coupled polymer product.

TABLE 2

| Run # | Agitation Rate (RPM) | E (L/g.cm) | Yield (%) |
|---|---|---|---|
| 1 | 100 | 16 | 63 |
| 2 | 300 | 22 | 68 |

EXAMPLE 3

To a 5-L cooling-jacketed round-bottomed flask were added, in sequence, 4-nitroaniline (2.5 mole, 345 g), water (2.0 L), and hydrochloride acid (37%, 0.5 L) under stirring. The mixture was cooled to 0–10 ° C. and pre-chilled IBN (15° C.-2.6 mole, 268 g) was added to the flask. The diazotization reaction took place immediately. After the addition of the IBN was completed, the reaction mixture was stirred for an additional hour. The diazonium salt solution that was formed was then ready for the continuous azo coupling reaction.

To a 20-L glass reactor were added PHS-MMA (55:45 mole ratio-2.5 mole, 300 g), THF (6.0 L), water (2.0 L), methanol (3.0 L), and tetraethylammonium hydroxide (TMAH, 25%, 2.5 L) and the mixed solution was cooled to 0–10° C. The azo coupling reaction was carried out by simultaneously pumping the diazonium salt solution and the PHS solution through a ¼"×60" in-line static mixer (available from Cole-Parmer Instrument Co.). Two gear pumps (70 and 80 in FIG. 1) were utilized in order to achieve smooth and substantially pulseless flow. The diazonium salt and the PHS solution were added at a molar ratio of 1 to 1 of diazonium salt to PHS. The flow rates were measured gravimetrically by two balances (30 and 40 in FIG. 1). The contact time of the two feed streams was about 20 seconds. It took about 70 minutes to pump all the diazonium salt and the PHS-MMA solution through the in-line mixer. The azo-coupled product was precipitated directly into 30 L of water and was collected as a reddish solid with a 90% yield. In this particular case the minimum reaction time was defined as the time it took to achieve a desired product yield of 50% or greater, and as the yield exceeded this value the contact time (estimated here to be 20 seconds) was longer than the minimum reaction time, which was defined as the time it would take to obtain a yield of at least 50%. In this reaction, the optimum minimum reaction time, was defined as the time to produce a yield of 80% or more of the desired product. The UV-Visible spectrum of the product in ethyl lactate showed $\lambda$max at 390 nm and extinction coefficients (E) of 42 L/g.cm. The GPC showed that the polymer had a Mw of 11,200.

EXAMPLE 4

To a 5 L cooling-jacketed round-bottomed flask, equipped with a mechanical stirrer and a temperature controller, were added, in sequence, 4-aminoacetanilide (AAA, 2.5 mole, 375.0 g), water (1.5 L), and hydrochloride acid (37%, 0.5 L) under stirring. The suspension was cooled to 0–5 ° C. Pre-chilled IBN (15° C.-2.55 mole, 262.6 g) was added to the flask. As AAA reacted, the newly formed diazonium salt dissolved in water to give a brownish solution.

In a 20 L reactor PHS-MMA (55–45 mole ratio, 2.3 mole, 506 g) was dissolved in a mixture of THF (4.9 L), water (1.3 L), methanol (2.5 L), and TMAH (25%, 1.9 L) at 5 ° C. The diazonium salt solution and the polymer solution were pumped through a ¼"×6 in-line static mixer connected with a centrifugal pump at a flow rate ratio of 1 to 4.2 of diazonium salt solution to PHS-MMA solution. The flow rates were monitored gravimetrically. The contact time of the reactants was estimated to be about 2 seconds. It took about 50 minutes to pump all of the diazonium salt and the PHS-MMA solution through the in-line mixer and the centrifugal pump. The azo-coupled product was precipitated into 25 L of water and was collected as a reddish solid, with a 95% yield. In this particular case the minimum reaction time was defined as the time it took to achieve a desired product yield of 50% or greater, and as the yield exceeded this value the contact time was longer than the minimum reaction time, defined as the time it took to obtain a yield of at least 50% yield. In this reaction, the optimum minimum reaction time, was defined as the time to produce a yield of 80% or more, of the desired product. The UV-Visible spectrum of the polymer in ethyl lactate showed $\lambda$max at 359 nm and (E) of 50 L/g.cm. The GPC showed that the polymer had a Mw of 18,500.

EXAMPLE 5

2-(Methacryloyloxy)ethyl acetoacetate (MEAA, 2.5 mole, 535.0 g) and THF (4.0 L) were added into a 10 L round-bottomed flask. The solution was degassed by bubbling nitrogen through the solution for about I hour. Methyl methacrylate (MMA, 2.5 mole, 250.0 g) and a solution of 2,2'-azobisisobutyronitrile (AIBN, 41.0 g) in THF were then injected into the first solution. The mixture was further degassed with nitrogen for 30 minutes. The nitrogen outlet needle was then removed and the mixture in the sealed vessel was stirred overnight at 65° C. This solution was then precipitated into 25 L of 2-propanol. The polymer product (MEAA-MMA, 50-50 mole ratio) was collected as a yellow solid at a 96% yield. The GPC showed that the polymer had a Mw of 32,800.

EXAMPLES 6–11

Table 3 shows the polymers synthesized using the synthesis procedure described in Example 3 and gives the Mw for each polymer so synthesized, the peak absorbance ($\lambda$max) in EL and the extinction coefficient (E) for these polymers.

TABLE 3

| Ex. | Diazonium Salt | Polymer | Diazo./Polymer Mole Ratio | GPC Mw | $\lambda$max (NM) | E$\lambda$ (L/g.cm) | Yield (%) |
|---|---|---|---|---|---|---|---|
| 6 | 4-$NH_2C_6H_4CO_2H$ | PHS-MMA (50/50) | 1.2/1.0 | 9,362 | 335 | 45 | 86 |
| 7 | 4-$NH_2C_6H_4CO_2H$ | MEAA-MMA (50/50) | 1.0/1.0 | 51,500 | 359 | 52 | 91 |
| 8 | 4-$NH_2C_6H_4CO_2Et$ | MEAA-MMA (70/30) | 1.0/1.0 | 27,400 | 359 | 52 | 92 |
| 9 | AAA | PHS (100) | 0.7/1.0 | 5,200 | 358 | 55 | 94 |
| 10 | AAA | PHS-MMA (50/50) | 1.0/1.0 | 17,500 | 359 | 51 | 95 |
| 11 | AAA | MEAA-MMA (60/40) | 1.0/1.0 | 29,600 | 389 | 46 | 90 |

EXAMPLES 12–14

To a solution of 10.0 grams of the polymeric azo dye synthesized according to the procedure of Examples 8–10 and 156.0 grams of ethyl lactate were added 1.92 grams of Powderlink® 1174 crosslinking agent and 0.50 grams of Powderlink® MTSI thermal acid generator (both are available from CYTEC Industries, Inc.). The formulation obtained was spin-coated at 3000 rpm onto a 4-inch non-HMDS (hexamethyldisilazane) treated silicon wafer and baked on a hot plate at 200° C. for 60 seconds. The coated wafer was then immersed in ethyl lactate for 60 seconds and then spin-dried. The film thickness before and after immersion for the was measured by a NANOSPEC®-AFT. The extent of interlayer mixing between the azo dye coating and the solvent was determined by the changes of the azo dye film thickness as listed in Table 4 below. It is clear that the solubility of the azo dye coating of the present invention in typical photoresist casting solvents is negligible.

TABLE 4

| Example | Dye synthesized in | $T_1$ (Å) | $T_2$ (Å) |
|---|---|---|---|
| 12 | Example 8 | 1108 | 1099 |
| 13 | Example 9 | 1856 | 1838 |
| 14 | Example 10 | 1723 | 1721 | where, $T_1$=polymer film thickness in Angstroms, before solvent immersion $T_2$=polymer film thickness in Angstroms, after solvent immersion

EXAMPLE 15

Dye solutions formulated according, to the procedure of Examples 12–14 were each spin-coated onto a 4-inch non-HMDS treated silicon wafer and each baked on a hot plate at 200° C. for 60 seconds to give a film thickness of about 1950 Å. The wafers were then each coated with AZ® 7805 i-line photoresist (available from Clariant Corporation, 70 Meister Ave., Somerville, N.J. 08876) and each baked at 90° C. for 90 seconds to give a photoresist film thickness of 0.50μm. A 4-inch HMDS treated silicon wafer was coated with AZ® 7805 photoresist at 0.50μm film thickness and baked at 90° C. for 60 seconds and was used as the reference. These wafers were then each imagewise exposed with a NIKON® 0.54 NA i-line stepper. The exposed wafers were then each baked at 110° C. for 60 seconds and each puddle developed with AZ® 300 MIF TMAH Developer (available from Clariant Corporation, 70 Meister Ave., Somerville, N.J. 08876) for 35 seconds. The resist patterns generated on each of these wafers were using a Hitachi® S-4000 field emission scanning electron microscope. Table 5 shows the comparison of lithographic performance of AZ® 7805 photoresist with and without the bottom antireflective coating of the present invention. The bottom antireflective coating of the present invention clearly improves the resolution and effectively eliminate standing waves caused by wafer substrate reflection, without sacrificing resolution.

TABLE 5

| Bottom Coating Solution | DTP (mj/cm$^2$) | Resolution (μm) | Standing Wave |
|---|---|---|---|
| None | 195 | 0.38 | Severe |
| Example 12 | 210 | 0.30 | Eliminated |
| Example 13 | 205 | 0.30 | Eliminated |
| Example 14 | 210 | 0.30 | Eliminated | where,

DTP is dose to print in millijoules per square centimeter (mj/cm$^2$)

EXAMPLE 16

Azo dye solutions formulated according to the procedure of Examples 12–14 were each spin-coated onto a 4-inch non-HMDS treated silicon wafer and baked on a hot plate at 180° C. for 60 seconds to give a film thickness of about 1950 Å. The wafers were each then coated with AZ® 7908 photoresist (available from Clariant Corporation, 70 Meister Ave., Somerville, N.J. 08876) and each baked at 90° C. for 90 seconds to give a resist thickness from 0.75 μm to 1.10 μm. These wafers were then each imagewise exposed using a NIKON® 0.54 NA i-line stepper, then each baked at 110° C. for 60 seconds and each puddle developed with AZ® 300 MIF TMAH Developer for 35 seconds. The minimum dose required to clear the film (Dose to Clear—DTC) was plotted as a function of resist thickness, the sinusoidal curve thus obtained is called the swing curve. The swing curve ratio (swing ratio) of a photoresist is closely related to the line width variation of the photoresist pattern over a highly reflective substrate or topography commonly encountered in semiconductor device manufacturing. The lower the swing ratio, the better the line width control over their reflective substrate or topography. The swing ratio was calculated using the equation:

Swing Ratio=(Emax−Emin)/(Emax+Emin)

where, Emax and Emin correspond to the dose-to-clear of a resist thickness at the maximum and minimum on a swing curve. Swing curves were generated by plotting the dose required to clear a resist film after development as a function of the resist thickness.

$$\% \text{ Swing Reduction} = \frac{(\text{Swing Ratio on silicon} - \text{Swing Ratio on polymer})}{\text{Swing Ratio on silicon}}$$

where, Swing Ratio on silicon and Swing Ratio on polymer correspond to the swing ratio of photoresist coated on silicon wafer and on polymer bottom antireflective coating respectively.

The %Swing Ratio Reduction of AZ® 7908 photoresist over the antireflective coatings of the present invention are listed in Table 6. It is clear that the polymer coatings of the present invention can effectively reduce the swing ratio of the photoresist.

TABLE 6

| Bottom Coating Solution | % Swing Ratio Reduction |
|---|---|
| None | 0 |
| Example 12 | 92 |
| Example 13 | 90 |
| Example 14 | 90 |

Unless otherwise specified, all parts and percents are by weight; all molecular weights (Mw) are weight average molecular weights; all temperatures are in degrees Centigrade; alkyl is $C_1$–$C_{10}$ alkyl; aryl or aromatic group signifies a group containing 1–3 aromatic rings and includes unsubstituted or alkyl, alkoxyl, hydroxyl, hydroxyalkyl, fluoroalkyl, carboxylic acid and ester, or halo substituted aryl groups such as but not limited to phenyl, tolyl, bisphenyl, trisphenyl, phenylene, biphenylene, naphthyl or anthracyl; halo or halogen means chloro-, fluoro-, or bromo-fluoroalkyl groups may be linear or branched and include by trifluoromethyl, 1,1,2-trifluoriethyl, pentafluoroethyl, perfluoropropyl, perfluorobutyl and 1,1,2,3,3-pentafluorobutyl; alkoxy can include methoxy, ethoxy, n-propyoxy, isopropoxy, n-butoxy- isobutoxy, tert-butoxy, pentyloxy, hexyloxy, heptyloxy, octyloxy, nonyloxy, decanyloxy, 4-methylhexyloxy, 2-propyheptyloxy, 2-ethyloctyloxy, 4-methylhexyloxy, 2-propyheptyloxy, 2-ethyloctyloxy, phenoxy, tolyoxy, xylyloxy, phenylmethoxy, etc.; carboxylic acid or carboxylic ester is a $C_1$–$C_{10}$ alkyl carboxylic acid or ester.

What is claimed is:

1. A method of coupling a diazonium salt with an organic polymer comprising, in the following order, the steps of:
    a) dissolving an organic polymer having a weight average molecular weight ranging from about 500 to 2,000,000 in a solvent, thereby providing one liquid phase;
    b) providing a diazonium salt in another solvent, thereby providing a separate liquid phase;
    c) contacting the diazonium salt liquid phase and the organic polymer liquid phase, for a period of time that is greater than or equal to the minimum reaction time required to react said diazonium salt with said organic polymer, and thereby reacting said organic polymer and said diazonium salt;
    further comprising intimately mixing the separate phases using an in-line mixing unit selected from: a static tubular reactor and a dynamic mixer.

2. A method according to claim 1, wherein said polymer has a weight average molecular weight ranging from about 3000 to 1,000,000.

3. A method according to claim 1, wherein said polymer has a weight average molecular weight from about 5000 to 80,000.

4. A method according to claim 1, wherein said synthetic organic polymer contains at least one of the following moieties:

where,

R is selected from a substituted or unsubstituted aromatic group, a substituted or unsubstituted heterocyclic group, or a group having the structure:

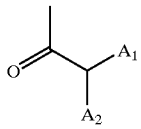

where, $A_1$ and $A_2$ are independently selected from the group: halo, —CN, —COZ, —COOZ, —CONHZ, —CONZ$_2$, —SO$_2$NHZ, —SO$_2$NZ$_2$, —SO$_2$Z, —SO$_2$CF$_3$, where Z is H, (C$_1$–C$_{10}$) alkyl, (C$_1$C$_{10}$) hydroxyalkyl, (C$_1$–C$_{10}$,) alkoxyl, (C$_1$–C$_{10}$) fluoroalkyl, (C$_{1-C10}$) epoxyalkyl, (C$_1$–C$_{10}$) alkenyl, substituted or unsubstituted carbocyclic, aromatic or heterocyclic group, or may be —COOM, —SO$_3$M, where M is alkali metal, ammonium, alkyd ammonium;

or $A_1$ and $A_2$ are combined to form a 3–10 membered substituted or unsubstituted carbocyclic or heterocyclic ring containing an α-carbonyl group, said polymer optionally further comprising one or more co-monomer moieties having a structure:

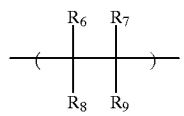

where, $R_6$–$R_9$ are independently either halo, —O(CH$_2$)$_x$—OH (where x=1–10), O(CH$_2$CH$_2$)$_y$—OH, —(OCH$_2$CH$_2$)$_y$—OH (where y=0–10), —CN, Z, —OZ, —OCOZ, —COZ, —COOZ, —NHZ, —NZ$_2$, —NHCOZ, —CONHZ, —CONZ$_2$, SZ, —SO$_3$Z, —SO$_2$NHZ, —SO$_2$N$_2$, —SO$_2$Z, —SO$_2$CF$_3$, where Z is H, (C$_1$–C$_{10}$) alkyl, (C$_1$–C$_{10}$) hydroxyalkyl, (C$_1$–C$_{10}$) alkoxyl, (C$_1$–C$_{10}$) fluoroalkyl, (C$_1$–C$_{10}$) epoxyalkyl, (C$_1$–C$_{10}$) alkenyl, 3–10 membered substituted or unsubstituted carbocyclic or heterocyclic group., or $R_8$ and $R_9$ are combined to form a 3–10 membered carbocyclic or heterocyclic ring.

5. A method according to claim 4, wherein said organic polymer additionally comprises one or more moieties selected from (1):

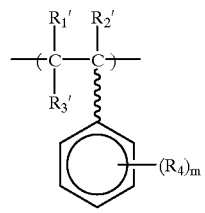

where, $R_1$–$R_{3'}$ and $R_4$ are independently either halo, nitro, —O(CH$_2$)$_x$—OH, —O(CH$_2$CH$_2$)$_x$OH (where x=1–10), —(OCH$_2$CH$_2$)$_y$—OH (where y=0–10), —CN, Z, —OZ, —OCOZ, —COZ, —COOZ, —NHZ, —NZ$_2$, —NHCOZ, —CONHZ, —NZCOZ, —CONZ$_2$', SZ, —SO$_3$Z, —SO$_2$NHZ, —SO$_2$NZ$_2$, —SO$_2$Z, —SO$_2$CF$_3$, where Z is H, (C$_1$–C$_{10}$) alkyl, (C$_1$–C$_{10}$) hydroxyalkyl, (C$_1$–C$_{10}$) alkoxyl, (C$_1$–C$_{10}$) fluoroalkyl, (C$_1$–C$_{10}$) epoxyalkyl, (C$_1$–C$_{10}$) alkenyl, 3–10 membered substituted or unsubstituted carbocyclic or heterocyclic group; or —COOM, —SO$_3$M, where M is alkali metal, ammonium, alkyl ammonium, or $R_{1'}$ and $R_{2'}$ are combined to form a 3–10 membered carbocyclic or heterocyclic ring;

m=0–4;

or (2):

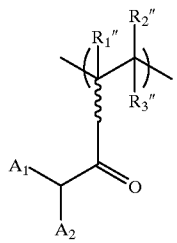

where, $R_{1''}$–$R_{3''}$ are independently either —Z, —OZ, —OCOZ, —COZ, —COOZ, —NHZ, —NZ$_2$, —NHCOZ, —CONHZ, —NZCOZ, —CONZ$_2$, —SZ, —SO$_3$Z, —SO$_2$NHZ, —SO$_2$NZ$_2$, —SO$_2$Z, —SO$_2$CF$_3$, where Z is H, (C$_1$–C$_{10}$) alkyl, (C$_1$–C$_{10}$) hydroxyalkyl, (C$_1$–C$_{10}$) alkoxyl, (C$_1$–C$_{10}$) fluoroalkyl, (C$_1$–C$_{10}$) epoxyalkyl, (C$_1$–C$_{10}$) alkenyl, a substituted or unsubstituted carbocyclic or heterocyclic ring, or $R_1''$ and $R_2''$ are combined to form a 3–10 membered carbocyclic or heterocyclic ring, $A_1$ and $A_2$ are independently selected from the group: halo, —CN, —Z, —OCOZ, —COZ, —COOZ, NHZ, —NZ$_2$, —NHCOZ, —CONHZ, —NZCOZ, —CONZ$_2$,—SZ, SO$_3$Z, —SO$_2$NHZ, —SO$_2$NZ$_2$, —SO$_2$Z, —SO$_2$CF$_3$, where Z is H, (C$_1$–C$_{10}$) alkyl, (C$_1$–C$_{10}$) hydroxyalkyl, (C$_1$–C$_{10}$) alkoxyl, (C$_1$–C$_{10}$) fluoroalkyl, (C$_1$–C$_{10}$) epoxyalkyl, (C$_1$–C$_{10}$) alkenyl, 3–10 membered substituted or unsubstituted carbocyclic or heterocyclic ring; or —COOM, —SO$_3$M, where M is alkali metal, ammonium, alkyl ammonium; or $A_1$ and $A_2$ are combined to form a 3–10 membered substituted or unsubstituted carbocyclic or heterocyclic ring containing an α-carbonyl group.

6. A method according to claim 1, wherein said diazonium salt has the general structure:

$$ArN_2^+X^-$$

where,

Ar is an aryl group

X is selected from the group consisting of Cl, Br, —$NO_3$, —$HSO_4$, —$OCOCH_3$, and —OH.

7. A method according to claim 1, wherein said diazonium salt is derived from an aryl amino acid or an amino substituted aromatic compound.

8. A method according to claim 1, wherein said organic polymer is a vinyl polymer.

* * * * *